(12) United States Patent
Feyh et al.

(10) Patent No.: US 9,093,594 B2
(45) Date of Patent: Jul. 28, 2015

(54) MULTI-STACK FILM BOLOMETER

(71) Applicant: Robert Bosch GmbH, Stuttgart (DE)

(72) Inventors: Ando Lars Feyh, Palo Alto, CA (US);
Po-Jui Chen, Cupertino, CA (US);
Fabian Purkl, Palo Alto, CA (US);
Gary Yama, Mountain View, CA (US);
Gary O'Brien, Palo Alto, CA (US)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 14/054,923

(22) Filed: Oct. 16, 2013

(65) Prior Publication Data
US 2014/0103210 A1 Apr. 17, 2014

Related U.S. Application Data

(60) Provisional application No. 61/715,038, filed on Oct. 17, 2012.

(51) Int. Cl.
*G01J 5/20* (2006.01)
*H01L 31/09* (2006.01)
*H01L 37/02* (2006.01)
*G01J 5/02* (2006.01)
*G01J 5/10* (2006.01)
*G01J 5/08* (2006.01)

(52) U.S. Cl.
CPC ............... *H01L 31/09* (2013.01); *G01J 5/024* (2013.01); *G01J 5/0853* (2013.01); *G01J 5/10* (2013.01); *G01J 5/20* (2013.01); *H01L 37/02* (2013.01)

(58) Field of Classification Search
CPC .......................................................... G01J 5/20
USPC ....................................................... 250/338.4
See application file for complete search history.

(56) References Cited

U.S. PATENT DOCUMENTS

| 6,201,243 | B1 | 3/2001 | Jerominek |
| 7,002,153 | B1 | 2/2006 | Gillham et al. |
| 7,106,167 | B2 | 9/2006 | Parsons |
| 7,842,533 | B2 | 11/2010 | Liger |
| 2004/0140428 | A1 | 7/2004 | Ionescu et al. |
| 2010/0171190 | A1 | 7/2010 | Liger |
| 2011/0062329 | A1* | 3/2011 | Ben-Bassat ............ 250/330 |
| 2012/0060589 | A1 | 3/2012 | Gridelet et al. |
| 2012/0097853 | A1* | 4/2012 | Ouvrier-Buffet et al. .... 250/349 |
| 2013/0022077 | A1* | 1/2013 | Harmon et al. ............ 374/178 |

FOREIGN PATENT DOCUMENTS

WO 2008014983 A1 2/2008

OTHER PUBLICATIONS

International Search Report and Written Opinion Corresponding to PCT Application No. PCT/US2013/065250, mailed Jan. 21, 2014 (11 pages).

* cited by examiner

*Primary Examiner* — David Porta
*Assistant Examiner* — Hugh H Maupin
(74) *Attorney, Agent, or Firm* — Maginot Moore & Beck LLP

(57) ABSTRACT

A semiconductor device includes a substrate, suspension structures extending from the upper surface of the substrate, and an absorber stack attached to the substrate by the suspension structures. The suspension structures suspend the absorber stack over the substrate such that a gap is defined between the absorber stack and the substrate. The absorber stack includes a plurality of metallization layers interleaved with a plurality of insulating layers. At least one of the metallization layers has a thickness of approximately 10 nm or less.

20 Claims, 3 Drawing Sheets

MULTI-STACK FILM BOLOMETER

CROSS-REFERENCE TO RELATED APPLICATIONS

This application claims priority to U.S. Provisional Application Ser. No. 61/715,038 entitled "MULTI-STACK FILM BOLOMETER" by Feyh et al., filed Oct. 17, 2012, the disclosure of which is hereby incorporated herein by reference in its entirety.

TECHNICAL FIELD

This invention relates to semiconductor sensor devices and methods of fabricating such devices.

BACKGROUND

In general, infrared radiation (IR) sensors are used in a variety of applications to detect infrared radiation and provide an electrical output that is a measure of the incident infrared radiation. IR sensors typically use either photonic detectors or thermal detectors for detecting the infrared radiation. Photon detectors detect incident photons by using the energy of the photons to excite charge carriers in a material. The excitation of the material is then detected electronically. Thermal detectors also detect photons. Thermal detectors, however, use the energy of said photons to increase the temperature of a component. By measuring the change in temperature, the intensity of the photons producing the change in temperature can be determined.

Photonic detectors typically have higher sensitivity and faster response times than thermal detectors. However, photon detectors must be cryogenically cooled in order to minimize thermal interference, thus increasing the cost, complexity, weight, and power consumption of the device. In contrast, thermal detectors operate at room temperature, thus avoiding the cooling required by photon detector devices. As a result, thermal detector devices can typically have smaller sizes, lower costs, and lower power consumption than photon detector devices.

One type of infrared thermal detector is a bolometer. A bolometer includes an absorber element for absorbing infrared radiation and a transducer element that has an electrical resistance that varies with temperature. In operation, infrared radiation incident upon the bolometer will be absorbed by the absorber element of the bolometer and the heat generated by the absorbed radiation will be transferred to the transducer element. As the transducer element heats in response to the absorbed radiation, the electrical resistance of the transducer element will change in a predetermined manner. By detecting changes in the electrical resistance, a measure of the incident infrared radiation can be obtained.

Because bolometers must first absorb incident electromagnetic radiation to induce a change in temperature, the efficiency of the absorber in a bolometer relates to the sensitivity and accuracy of the bolometer. Ideally, absorption as close to 100% of incident electromagnetic radiation is desired. Recent advances in technology have enabled the absorber element of a bolometer to be formed by atomic layer deposition (ALD). ALD enables absorber elements to be formed as thin metal films with precise and uniform thickness. ALD thin film bolometers are typically capable of greater absorption efficiency than non ALD thin film bolometers. While traditional ALD thin film bolometers devices and methods of fabrication are effective, there is always a need to improve the efficiency, simplify the fabrication, and/or decrease the production costs of such devices.

DETAILED DESCRIPTION

Figure 1:
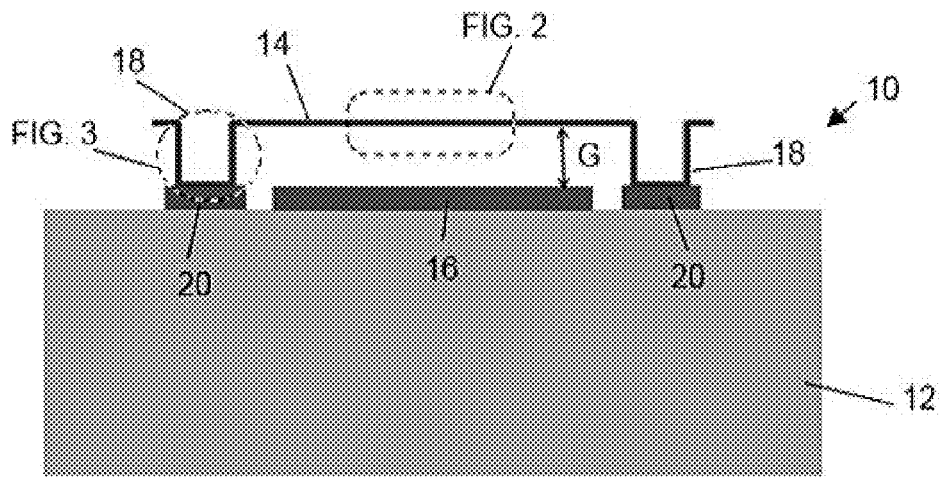
FIG. 1 depicts a side schematic view of a bolometer sensor with an absorber implemented by a multi-stack film composition in accordance with the present disclosure.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to a person of ordinary skill in the art to which this disclosure pertains.

FIG. 1 depicts a perspective view of an embodiment of a bolometer sensor 10 in accordance with the present disclosure. Such a sensor is useful in a variety of applications including temperature sensors, IR sensors, IR sensor arrays, thermal imagers, night vision cameras, remote temperature sensing, and the like. The sensor 10 includes a substrate 12, an absorber 14, and a reflector 16. The substrate 12 may comprise a complementary metal oxide semiconductor (CMOS) substrate or on another type of substrate, having an upper surface and a sensing region. Although a single sensor 10 is depicted in FIG. 1, the substrate 12, which in this embodiment is a silicon wafer, may be fabricated with a plurality of bolometer sensors that form a microbolometer array (not shown) with each bolometer corresponding to a pixel of the array.

The absorber 14 comprises a thermally sensitive multi-stack film composition that is configured to change temperature in a predetermined manner in response to the absorption of incident infrared radiation. The absorber 14 includes a transducer element 32 (FIGS. 2 and 3) having an electrical resistance that changes with changes in temperature of the absorber 14. To minimize thermal loss to the substrate, the absorber 14 is suspended above the substrate by suspension structures 18. The suspension structures 18 space the absorber 14 a distance G apart from the upper surface of the substrate in the sensing region.

The suspension structures 18, in addition to establishing the gap G between the absorber 14 and the upper surface of the substrate, are configured to electrically connect the absorber 14 to wiring contacts 20, such as bonding pads and runners, provided on the substrate. The wiring contacts 20 are in turn electrically connected to the readout circuitry (not shown) provided in the substrate 12. In one embodiment, the wiring contacts 20 are formed by a metallization layer that has been deposited on the substrate and patterned, e.g., by etching, to form the wiring contacts 20. The readout circuitry is configured to pass a known current through the transducer element 32 and measure the change in electrical resistance of the transducer element 32 to determine the incident infrared radiation.

A reflector 16 is disposed on the upper surface of the substrate 12 in the sensing region underlying the absorber 14. The reflector 16 may comprise, for example, a metallization layer or a multilayer dielectric formed on the substrate 12. In one embodiment, the reflector 16 is formed by patterning the same metallization layer used to form the wiring contacts 20. The reflector 16 is configured to reflect infrared radiation that passes through the absorber without being absorbed back toward the absorber 14 for absorption. The gap distance G between the absorber and reflector is selected to optimize absorption for a given wavelength or wavelength range. In one embodiment, the gap G between the reflector 16 and the absorber 14 is about 2.5 µm although any suitable gap distance may be utilized.

Figure 2:
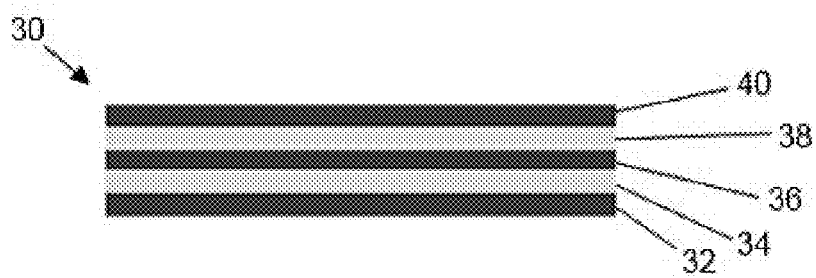
FIG. 2 is a partial view of the multi-stack film absorber of FIG. 1 showing the film sequence of the stack.
Figure 3:
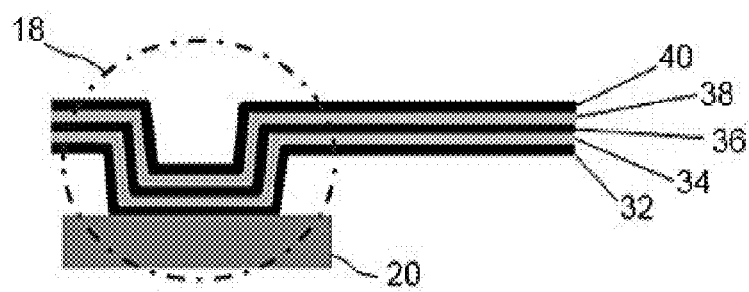
FIG. 3 is a view of the suspension structure of the multi-stack film absorber of FIG. 1.

Referring to FIGS. 2 and 3, a multi-stack film composition 30 is configured to serve as the absorber 14 for the bolometer sensor 10. The multi-stack 30 comprises a plurality of metallization layers or films interleaved with a plurality of insulating layers or films. The interleaved metallization and insulating films are deposited in an alternating pattern using atomic layer deposition (ALD). In the embodiment of FIGS. 2 and 3, the multi-stack 30 includes a lower metallic thin film 32, a first insulating thin film 34, an intermediate metallic thin film 36, a second insulating thin film 38, and an upper metallic thin film 40. Each thin film layer is deposited at a thickness of a few nanometers. The use of such a multi-stack enables an absorber for a bolometer to be realized with film thicknesses tailored to produce desired electrical resistance and absorption characteristics in a structurally stable configuration.

The metallic thin films 32, 36, 40 are formed of metals that have suitably high temperature coefficients of resistance while exhibiting low excess noise (e.g., 1/f noise, Johnson noise, . . . ). Examples of metals that can be used for the metallic films of the multi-stack include platinum (Pt), titanium (Ti), and titanium nitride (TiN). In the exemplary embodiment of FIGS. 2 and 3, the metallic thin films 32, 36, 40 are formed of platinum (Pt). At least one of the metallic thin films 32, 26, 40 is deposited at a thickness of approximately 10 nm or less. In some embodiments, all of the metallic films are deposited at a thickness of approximately 10 nm or less. It is also contemplated that one or more or all of the metallic thin films 32, 36, 40 be deposited at thicknesses that are approximately 5 nm or less. The metallic thin films 32, 36, 40 may each have the same thickness, or they may each be provided at different thicknesses depending on their position in the stack.

The metallic thin films 32, 36, 40 are electrically isolated from each other by the interleaved insulating thin films 34, 38. The insulating films are formed of insulating compounds including various types of oxides, such as aluminum (III) oxide (Al2O3), hafnium (IV) oxide (HfO2), and zirconium dioxide (ZrO2), or formed of two or more of these and/or other materials. In the exemplary embodiment of FIGS. 2 and 3, the insulating films 34, 38 are formed of aluminum oxide (Al2O3). The insulating thin films 34, 38 are deposited at thicknesses that are approximately 20 nm or less. In some embodiments, the insulating thin films are deposited at thicknesses that are approximately 10 nm or less, and, in some embodiments, can be 5 nm or less.

As seen in FIGS. 2 and 3, the alternating metallic and insulating films have a symmetrical arrangement from bottom to top which minimizes stress/stress gradient effects. The insulating films 34, 38 add structural stability to the multi-stack 30. In addition, the introduction of the insulating films 34, 38 between the metallic films 32, 36, 40 suppresses crystallite growth resulting in lower overall stress/stress gradient for the multi-stack.

The bottom metallic film 32 is electrically connected to the readout circuitry (not shown) and is configured to serve as the transducer element for the bolometer sensor 10. As depicted in FIG. 3, the suspension structures 18 are formed by U-shaped dips in the multi-stack film composition 30 that extend from the suspended portion of the absorber 14 to contact the bond pads 20 on the substrate 12. The bottom metallic film 32 is placed in contact with the bond pads 20 to electrically connect the transducer element to the readout circuitry (not shown). In alternative embodiments, the suspension structures 18 may comprise inter-metal vias (not shown) formed on the surface of the substrate that electrically connect the bottom metallic film 32 of the stack 30 to the bond pads 20 and/or the readout circuitry (not shown).

The metallic films 36, 40 and insulating films 34, 38 of the stack provide mechanical support and structural stability for the absorber 14. Because the bottom metallic film 32 is thin (e.g., less than 5 nm thick) and electrically isolated from the other metallic films 36, 40 of the stack 30, a high electrical resistance for the transducer element is possible. All of metallic thin films 32, 36, 40 of the multi-stack are used to absorb infrared radiation and generate heat for altering the temperature dependent resistance of the bottom metallic film 32.

Figure 4:
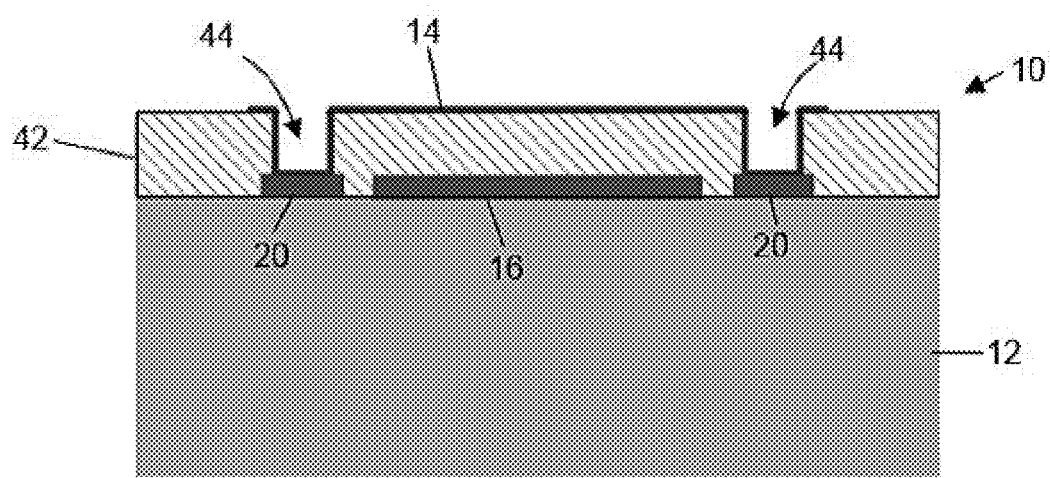
FIG. 4 is a side schematic view of a bolometer in an intermediate step of the fabrication process.

FIG. 4 shows the bolometer sensor 10 of FIG. 1 during an intermediate step of the fabrication process. The fabrication process for the bolometer includes depositing one or more metallizations on a substrate and patterning the metallizations to form the wiring contacts 20 and reflector 16 for the bolometer. The bond pads 20 are electrically connected to readout circuitry (not shown) which may also be formed on the surface of the substrate or may be implemented in the substrate by metallizations using a CMOS process.

A sacrificial layer of material 42, such as polymer, is deposited on the surface of the substrate over the wiring contacts and reflector metallizations. The sacrificial layer is patterned to form trenches 44 that expose the wiring contacts 20. An ALD process is then performed to deposit the bottom metallic film 32 (FIG. 3) of the multi-stack at a desired film thickness, e.g., less than 5 nm. The bottom metallic film 32 is formed in the trenches 44 and contacts the bond pads 20 as depicted in FIG. 3 to form an electrical connection with the readout circuitry (not shown).

The remaining films of the multi-stack are then deposited by ALD on top of the bottom metallic film 32 in the sequence and with film thicknesses as describe above to form the multi-stack 30. For example, one or both of the upper metallic films 36, 40 may each be provided at less than 10 nm and in some cases less than 5 nm. After the films of the multi-stack 30 have been deposited by ALD, the multi-stack is patterned to give the absorber a desired geometry. The sacrificial layer is then removed, e.g., by etching, to release the absorber.

The configuration of the multi-stack 30 provides benefits during the fabrication process. For example, because the lowest layer of the stack is metallic, the lithographic patterning steps that would otherwise be required for electrical contacts if the bottom layer was insulating can be eliminated. As a result, no interruption of vacuum flow (to perform the lithographic patterning) is needed so higher film quality can be attained. In addition, only one patterning step is required to shape the multi-stack which is cost efficient.

To eliminate the potential charging of the multi-stack film structure 30, the multi-stack 30 can be connected to ground potential (not shown in the figures). For example, the top metallic layer 40 of the multi-stack may be grounded by means of an additional deposition/lithographic step, such as by using a lift-off technique before the release of the film structure of the absorber. Charging can be also suppressed utilizing nm scale effects, such as tunneling, to equalize the potentials of the separated metallic films 32, 26, 40 in embodiments in which the film thicknesses are small, e.g., less than 10 nm. Of course, any grounding measures that are utilized do not affect the proposed functionality of the bottom metallic film of the stack as a temperature dependent resistor.

Figure 5:
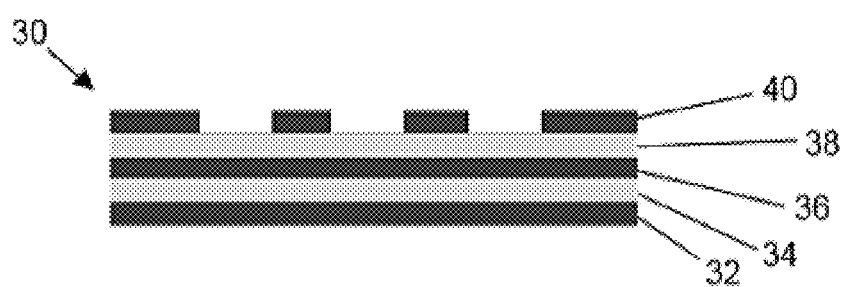
FIG. 5 is a partial view of an alternative embodiment of the multi-stack film absorber of FIG. 2 having a porous upper metallic film.

A number of modifications may be made to the above-described bolometer device to enhance certain properties and/or to optimize the device for use in certain applications. For example, in various alternative embodiments, one or both of the metallic thin films 36, 40 of the absorber may be porous, have voids, be electrically discontinuous, and/or be patterned in some manner. Such configurations can be useful for various purposes, such as increasing absorber stability and strength, tailoring absorption characteristics, enhancing optical transmission, reducing conductance, and the like. FIG. 5 depicts an embodiment of a film composition 30 for use as an absorber in which the upper metallic film 40 is formed as a porous layer.

Figure 6:
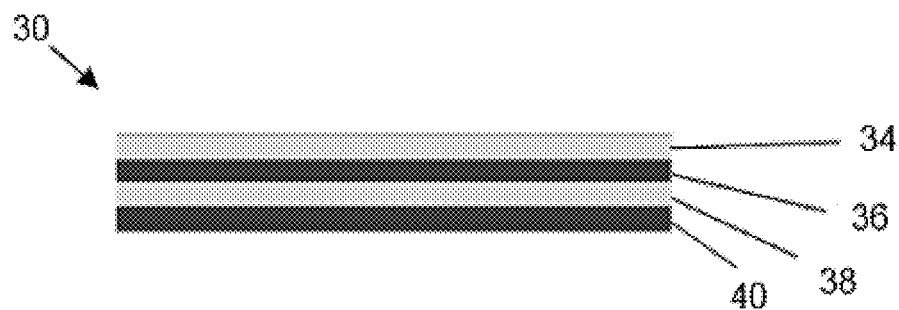
FIG. 6 is a partial view of another alternative embodiment of the multi-stack film absorber of FIG. 2 having four films arranged in a reversed film sequence with an outer insulating film.
Figure 7:
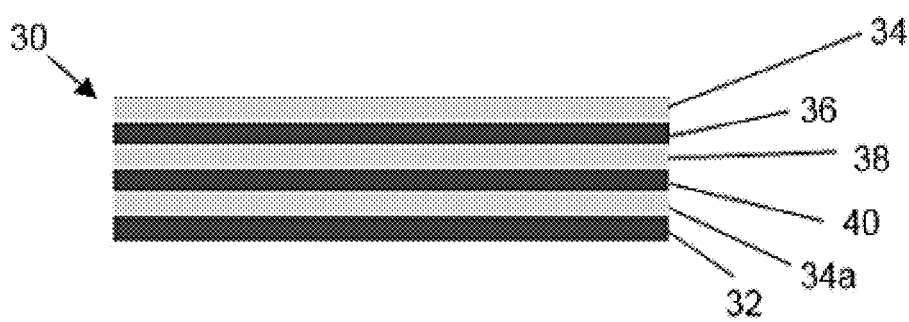
FIG. 7 is a partial view of another alternative embodiment of the multi-stack film absorber of FIG. 6 having six films with an outer insulating film.

As another alternative, the number of alternating layers provided in the stack may be varied to alter the properties and/or response of the device. For example, in one embodiment, the sequence of the film composition 30 is reversed relative to FIG. 2 with the metallic film 40 being provided as the lowest metallic film of the stack 30 as depicted in FIG. 6. The intermediate insulating film 38 is then deposited onto the lowest metallic film 40, the intermediate metallic film 36 is deposited onto the insulating film 38. The insulating film 34 is then deposited onto the intermediate metallic film 36 and comprises the outer film of the stack 30. The metallic film 40 is electrically connected to serve as the transducer while the upper films 38, 36, 34 are used for absorption and structural support. As an alternative to the configuration of FIG. 6, a third insulating film 34a may be provided below the metallic film 40 as depicted in FIG. 7. In the embodiment of FIG. 7, the insulating film 34a is deposited onto a metallic film 32 which is the lowest metallic film in this embodiment and is electrically connected to serve as the transducer while the upper films 34a, 40, 38, 36, 34 are used for absorption and structural support.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A semiconductor device comprising:
   a substrate having an upper surface that defines a sensing region;
   suspension structures extending from the upper surface of the substrate around the sensing region; and
   an absorber stack attached to the substrate by the suspension structures, the suspension structures suspending the absorber stack over the sensing region and spaced apart from the sensing region such that a gap is defined between the absorber stack and the sensing region,
   wherein the absorber stack includes a plurality of metallization layers interleaved with a plurality of insulating layers, and
   wherein at least one of the metallization layers has a thickness of approximately 10 nm or less.

2. The device of claim 1, wherein each of the metallization layers has a thickness of approximately 10 nm or less.

3. The device of claim 2, wherein at least one of the metallization layers has a thickness of 5 nm or less.

4. The device of claim 2, wherein each of the metallization layers is formed of one of platinum, titanium, and titanium nitride.

5. The device of claim 2, wherein each of the metallization layers is deposited using an atomic layer (ALD) deposition process.

6. The device of claim 2, wherein each of the insulating layers has a thickness of 20 nm or less.

7. The device of claim 6, wherein at least one of the insulating layers has a thickness of 5 nm or less.

8. The device of claim 6, wherein each of the insulating layers is formed of an oxide material.

9. The device of claim 6, wherein each of the insulating layers is deposited using an atomic layer (ALD) deposition process.

10. The device of claim 9, wherein each of the insulating layers and each of the metallization layers is deposited using an atomic layer (ALD) deposition process.

11. The device of claim 10, wherein the suspension structures electrically connect at least one of the metallization layers to the wiring contacts on the substrate.

12. The device of claim 11, wherein the suspension structures are formed by shaped portions of the absorber stack.

13. The device of claim 12, wherein the plurality of metallization layers includes a bottom metallization layer that is a lowermost layer in the absorber stack, and
   wherein the bottom metallization layer is included in the shaped portions and is electrically connected to the wiring contacts on the substrate.

14. The device of claim 10, wherein the plurality of metallization layers comprises three metallization layers.

15. The device of claim 10, wherein at least one of the metallization layers is porous.

16. A method of fabricating a semiconductor device, the method comprising:
   depositing at least one sacrificial layer on a substrate;
   defining suspension structures in the at least one sacrificial layer that are electrically connected to wiring contacts on the substrate;
   depositing an absorber stack on top of the at least one sacrificial layer, the absorber stack comprising a plurality of metallization layers and a plurality of insulating layers deposited in an alternating sequence using an atomic layer deposition process such that each of the metallization layers is deposited at a thickness of 10 nm or less, at least one of the metallization layers being electrically connected to the wiring contacts on the substrate via the suspension structures; and
   removing at least a portion of the at least one sacrificial layer to form a gap between the absorber stack and the substrate.

17. The method of claim 16, wherein each of the insulating layers is deposited at a thickness of 20 nm or less.

18. The method of claim 17, wherein the suspension structures are defined by patterning the sacrificial layer to form trenches and depositing the absorber stack into the trenches to form shaped portions that serve as the suspension structures.

19. The method of claim 18, wherein the plurality of metallization layers includes a bottom metallization layer that is a lowermost layer in the absorber stack, the bottom metallization layer being deposited in the trenches in electrical contact with the wiring contacts on the substrate.

20. The method of claim 19, wherein the insulating layers are formed of an oxide material.

* * * * *